United States Patent [19]
Chen et al.

[11] Patent Number: 5,945,352
[45] Date of Patent: Aug. 31, 1999

[54] METHOD FOR FABRICATION OF SHALLOW ISOLATION TRENCHES WITH SLOPED WALL PROFILES

[75] Inventors: Hung-Sheng Chen, San Jose; Mark S. Chang, Los Altos, both of Calif.

[73] Assignee: Advanced Micro Devices, Sunnyvale, Calif.

[21] Appl. No.: 08/994,710

[22] Filed: Dec. 19, 1997

[51] Int. Cl.[6] .................................................. H01L 21/302
[52] U.S. Cl. ...................... 438/713; 438/424; 438/433; 148/DIG. 50
[58] Field of Search .................. 438/424, 427, 438/433, 435, 713, 719, 978; 148/DIG. 50

[56] References Cited

U.S. PATENT DOCUMENTS

| 4,857,477 | 8/1989 | Kanamori . | |
|---|---|---|---|
| 5,674,775 | 10/1997 | Ho et al. | 148/DIG. 50 |
| 5,801,083 | 9/1998 | Yu et al. | 438/424 |
| 5,807,789 | 9/1998 | Chen et al. | 438/713 |

FOREIGN PATENT DOCUMENTS 2-271620  11/1990  Japan .

Primary Examiner—Trung Dang
Attorney, Agent, or Firm—LaRiviere, Grubman & Payne, LLP

[57] ABSTRACT

The present invention provides a method for fabricating shallow isolation trenches with sloped walls in semiconductor wafers. The method uses a conformal polysilicon layer to form an etch barrier over trench regions in a semiconductor substrate. This etch barrier has areas of varying thickness. The thickest areas of the etch barrier are located on the edges of trench structures and slow the etch process in the underlying substrate. The thinner regions of the etch barrier do not impede the etch process to as great an extent. This etch rate differential causes a sloped trench wall profile. The isolation trenches are completed by filling the surface with dielectric materials then planarizing.

12 Claims, 6 Drawing Sheets

Figure 7

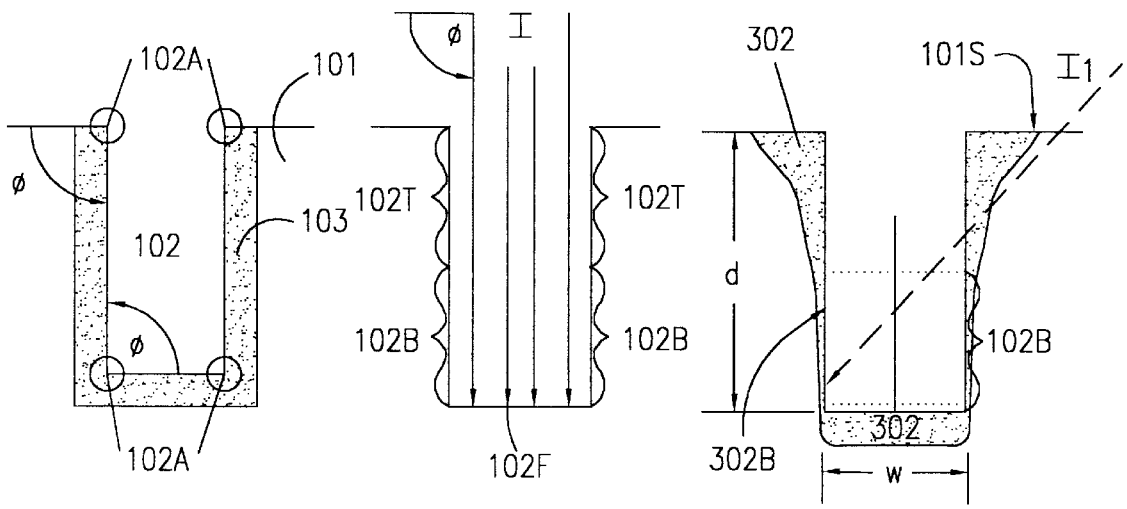
Figure 1 (Prior Art)
Figure 2 (Prior Art)
Figure 3 (Prior Art)
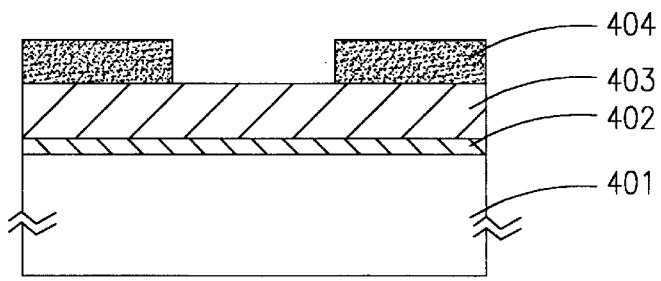
Figure 4
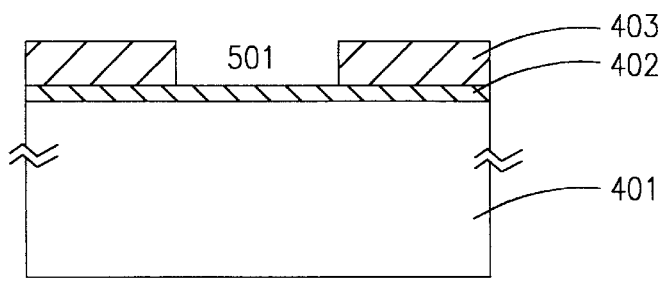
Figure 5

METHOD FOR FABRICATION OF SHALLOW ISOLATION TRENCHES WITH SLOPED WALL PROFILES

TECHNICAL FIELD

The present invention relates to the processes used in the fabrication of integrated circuits. More particularly, the invention relates to an advanced method for fabricating isolation trenches with sloped walls used in microelectronic circuits.

BACKGROUND OF THE INVENTION

Microelectronic circuitry, in the form of integrated circuits have utilized isolation trenches filled with electrically isolating materials to electrically isolate separate integrated circuit structures from one another. These same isolation trench structures may be doped to provide current paths between circuit structures. Furthermore, in doped wafers, the walls and floors of isolation trenches are heavily doped to increase their isolating effect. Abrupt transitions between active and isolation regions are necessary to maximize circuit density. Shallow trench isolation is one means for achieving the necessary abrupt transition. Existing technologies for trench fabrication stress the need for creating trenches with nearly vertical trench walls. The need for steep walled narrow trenches presents difficulties in doping the trench walls and bottoms. Thus, the need for doping and the need for deep narrow trenches are at cross purposes. Additionally, these nearly vertical walls create sharp angles (nearly 90°) at the trench corners (see angle $\phi$ of FIG. 1) which cause enhanced edge conduction. These sharp angles are known to cause electrical failures in integrated circuits and are a cause of circuit unreliability. This problem is known as the "edge effect".

Typical trench fabrication methods feature the etching of vertical walled trenches between active circuit areas, then filling the trenches with electrically isolating material (typically silicon dioxide), thereby electrically isolating independent circuit portions.

Other isolation processes exhibit similar problems along with unique problems of their own. For example, the so called LOCOS method, which selectively oxidizes patterns on a silicon substrate to create isolation regions, suffers from oxide encroachment of silicon dioxide under the silicon nitride layer. This oxide encroachment is known in the industry as a bird's beak. This bird's beak problem reduces the active circuit area between the isolation regions by encroaching into the active regions. As feature size decreases this becomes a more significant problem. Other known processes include a variation of the LOCOS process which is known in the industry as SWAMI, as developed by Hewlett Packard. The SWAMI process includes outwardly etching the silicon nitride and the pad oxides at 60 degrees such that the subsequent oxidation and beak formation length is limited. Other methods include using high-pressure oxidation techniques where the oxidation is grown faster and at a lower temperature which results in minimizing the growth of the bird's beak. But the end result is, that all of these methods suffer from the bird's beak problem which serves to restrict the active surface area putting a limit on circuit density.

The primary object of the present invention is to provide a sloped wall isolation trench which is more easily doped, thereby creating a more effective isolation trench. Another important object is the fabrication of sloped wall isolation trenches which reduce the edge effect and thereby increase circuit reliability.

A related object of the present invention is to provide fabrication processes for producing microelectronic integrated circuit structures featuring sloped wall isolation trenches in accordance with the forgoing objects.

Another related object of the present invention is to provide a sloped wall isolation trench which does not suffer from the bird's beak problem thereby conserving the maximum amount of microelectronic integrated circuit surface area.

SUMMARY OF THE INVENTION

The present invention is a method of fabricating isolation trenches. The invention produces sloped wall isolation trenches which are easier to dope and exhibit a lower circuit failure rate due to the "edge effect". The isolation trenches of the present invention do not suffer from the bird's beak problem. Therefore the active circuit area size is not reduced by bird's beak intrusion. This allows higher circuit density.

The invention may be practiced in several different formats. A standard method is disclosed as follows:

Standard wafer fabrication techniques are used to create the basic semiconductor substrate (which is usually silicon or gallium arsenide crystal). This basic semiconductor substrate (which may be doped or not) is then oxidized, subject to shield layer formation and masked by methods known to practitioners with ordinary skill in the art. The shield layer, which serves as a chemical mechanical polishing ("CMP") stop, is etched through openings in the mask pattern which defines the trench width. This first etch removes material until the underlying barrier oxide layer is reached, then the oxide layer is etched down to the substrate surface in the region defined by the first etch in a second etch step. The mask is then stripped off at this point. A conformal layer of polysilicon is then deposited over the substrate surface, covering both the etched and unetched areas. Polysilicon deposition is accomplished by any of the methods known to practitioners with ordinary skill in the art (e.g. atmospheric pressure chemical vapor deposition "APCVD," low pressure chemical vapor deposition "LPCVD," etc.). This polysilicon layer affects the trench etching process such that sloped trench walls are created. If dopants are added to the polysilicon layer they can effect the slope of the trench walls. As dopant concentration increases, the polysilicon layer becomes more easily etched and is eroded more quickly, leading to steeper trench profiles. The polysilicon layer also serves to protect the semiconductor substrate from sideways oxidation into the active regions adjacent to the isolation regions. During or after trench formation the polysilicon layer is completely etched away along with the semiconductor substrate, leaving a trench with sloped walls. At this point the sloped walls can be doped, if desired.

To complete the process of creating an isolation trench, the semiconductor substrate is coated with a layer of electrically isolating material (typically an oxide or other dielectric material), which is accomplished by any of the methods known to practitioners with ordinary skill in the art (e.g. deposition, thermal oxidation, etc.). The trenches are completely filled with electrically isolating material. CMP is then performed, planarizing the surface, with the aforementioned nitride shield layer serving as a CMP stop. The surface is the etched to remove the remaining nitride layer. What remains is a planar semiconductor substrate with sloped wall isolation trenches filled with electrically isolating material which electrically separates active surface regions of the semiconductor substrate.

Other features of the invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings in the following Detailed Description of the Invention.

FIG. 1 shows a vertical walled trench with an ideal dopant profile.

FIG. 2 shows the difficulties in effectively implanting the trench sidewalls of a vertical walled trench.

FIG. 3 shows a typical implantation dopant profile on a vertical walled trench.

FIG. 4 shows a cross section of semiconductor substrate with a pattern masked barrier oxide and shield layer in preparation for fabrication by the methods of the present invention.

FIG. 5 shows the substrate of FIG. 4, after a first etch through the shield layer to the barrier oxide layer and after photoresist removal.

DETAILED DESCRIPTION OF THE INVENTION

Figure 6:
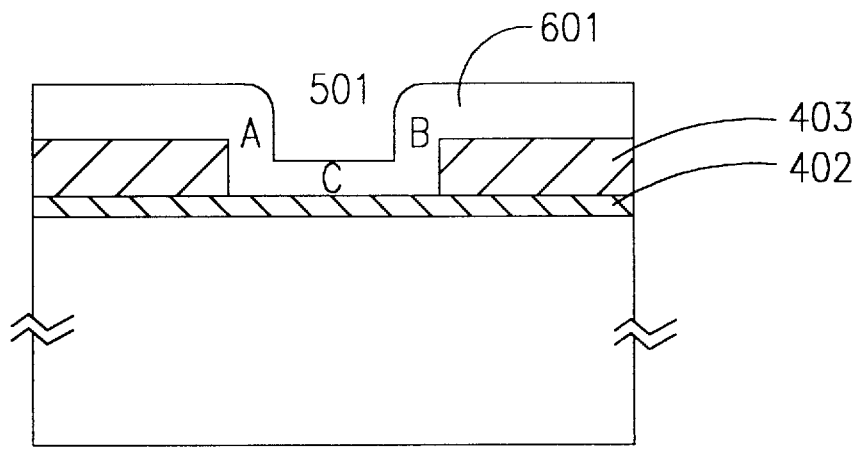
FIG. 6 shows the surface of FIG. 5 after fabrication of a polysilicon layer.

The methods disclosed above can be used to create sloped wall isolation trenches between the various integrated circuit components. The following procedure is the best mode for creating such trenches.

The present invention is best understood in view of the problems noted in the prior art. FIG. 1 depicts a vertical walled isolation trench (102) in an exemplar P-doped semiconductor substrate (101). Importantly, the trench has sharp edges at the corners (102A). These sharp edges (102A) cause increased conduction which leads to circuit failure. It is an object of the invention to reduce this "edge effect" by increasing the angle $\phi$ beyond 90° present in vertical walled trenches. The walls and floor of the trench are highly P-doped (103) and of uniform thickness. In practice, this ideal dopant profile is never realized in vertical walled trenches.

FIG. 2 depicts one of the big problems encountered in realizing the ideal doping profile. Doping is performed by a variety of methods (e.g. diffusion, ion implantation, etc.). FIG. 2 depicts ion implantation to dope the trench. For purposes of illustration, the trench inner surfaces are divided into a number of regions; floor (102F), bottom trench wall (102B) and top trench wall (102T). When the ion implantation beam (I) is at an angle normal to the wafer surface ($\theta$=90°), the trench floor (102F) is easily implanted. But in order to dope the trench walls (102B, 102T) the implantation angle ($\theta$) must be less than 90°.

FIG. 3 shows that as trench depth (d) increases and trench width (w) decreases, the ion implantation beam has difficulty effectively implanting the trench bottoms (102B), due to blockage of the ion implantation beam path by the semiconductor substrate surface (101S). This effect is shown by the blockage of the ion implantation beam ($I_1$). The end result is that the dopant profile is not ideal and typically resembles that shown by the shaded area (302). The dopant profile (302) becomes very thin near the bottom of the trench walls (302B). This can lead to circuit failure due to inadequate isolation. The present invention remedies this problem.

FIG. 4 shows a semiconductor substrate (401) (which is typically doped or undoped silicon) with a barrier oxide layer (402) and a shield layer (403) which may be formed from a variety of materials. For example, silicon nitride ($Si_3N_4$) or silicon oxynitride ($SiO_xN_y$, where x and y are integers) or combination by layers of $SiO_2/Si_3N_4$ or $SiO_2/SiO_xN_y$. The formation of such layers are well known to practitioners having ordinary skill in the art. Typically, silicon nitride or silicon oxynitride are used. These layers are formed by any of the standard oxidation or deposition techniques known to one with ordinary skill in the art. The barrier oxide layer (402), which is typically silicon dioxide, can be of any thickness, but generally is between about 100 Å and 200 Å. The shield layer (403) serves as a chemical mechanical polishing ("CMP") stop and is generally much thicker than the barrier oxide layer. The shield layer (403) is usually between about 1000 Å and about 2000 Å, with a preferred thickness of about 1700 Å. These layers are pattern masked with photoresist (404).

In FIG. 5, the shield layer (403), in the area defined by the photoresist mask, has been etched by existing etch techniques known to practitioners with ordinary skill in the art. What remains is a trench region (501) which has been etched down to the barrier oxide layer (402). The photoresist may then be removed in an optional step which can be accomplished at numerous other steps during the process. This leaves the profile depicted in FIG. 5.

FIG. 6 depicts the deposition of a polysilicon (601) layer over the substrate of FIG. 5. The polysilicon is deposited by any of the standard methods in the art (e.g. atmospheric pressure chemical vapor deposition ("APCVD"), low pressure chemical vapor deposition ("LPCVD"), etc.), coating the barrier oxide in the trench (501) and the remaining shield layer (403). Due to the nature of the polysilicon coating process, the vertical depth of polysilicon is thicker in regions (A) and (B) than it is in (C).

Figure 7:
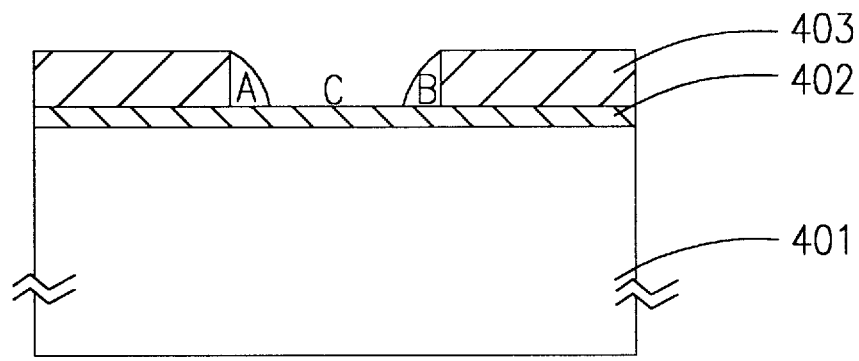
FIG. 7 shows the surface of FIG. 6 after the second etching step which forms polysilicon spacers.

FIG. 7 depicts a second etch step. Directional etching techniques (e.g. plasma etching, ion beam etching, reactive ion etching, etc.) are used to remove the polysilicon layer (601). During etching, the polysilicon layer is eroded. Due to the directional nature of the etching, the thinner areas (C) are eroded more rapidly than the thicker regions. This creates spacers in the thicker regions (A and B) while eroding the thinner region (C) down to the barrier oxide layer (402).

Figure 8:
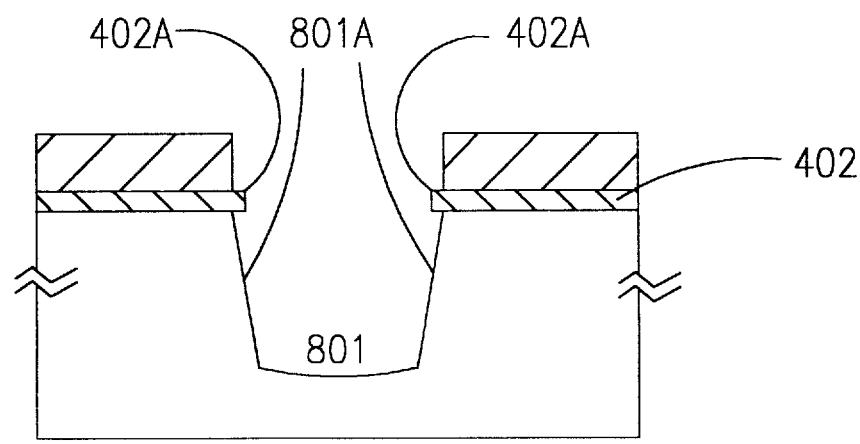
FIG. 8 shows the surface of FIG. 7 after a short third etching step etches away most of the barrier oxide and a fourth etch removes the polysilicon spacers and etches into the semiconductor substrate creating a sloped isolation trench profile.

After the spacers (A and B) are in place, a third etching takes place. The third etch uses techniques similar to that of the second etch (i.e. directional dry etch techniques), but typically is accomplished using reactive ion etching ("RIE"). The effect of this process is shown in FIG. 8. The spacers (A and B of FIG. 7) are slowly eroded, but serve as a barrier to the RIE until sufficiently eroded to allow RIE to effect the underlying substrate (401 and 402 of FIG. 7). This causes the center region (C of FIG. 7 to erode more quickly the areas under the spacers (A and B of FIG. 7) causing the sloped trench profile shown in FIG. 8. The majority of the barrier oxide (402) is also etched away due to the selectivity of the RIE. The final profile shows a shallow isolation trench (801) with sloped walls (801A) and a small barrier oxide residue (402A) intruding into the trench region (801).

Figure 12:
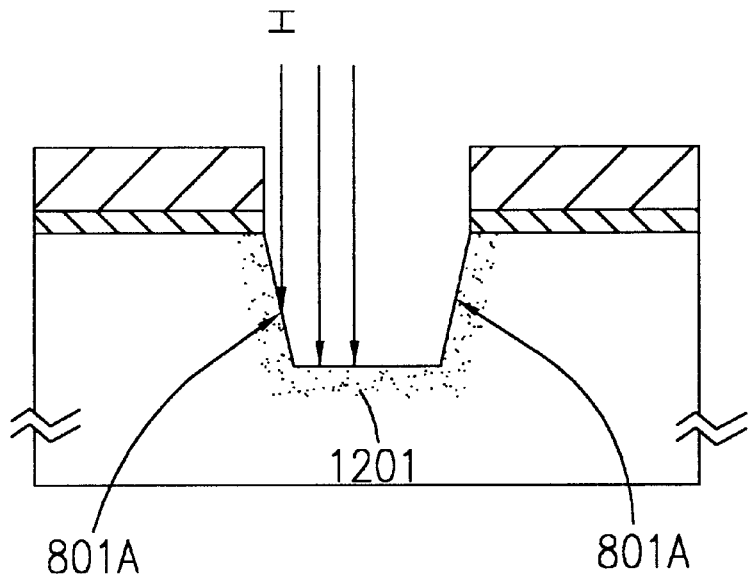
FIG. 12 depicts the effects of doping on a sloped trench profile.
Figure 13:
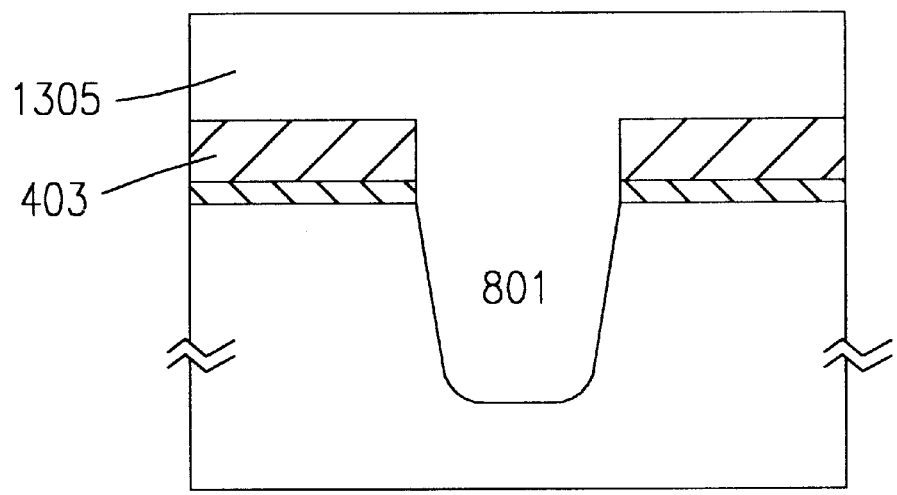
FIG. 13 shows the surface of FIG. 12 after a thick layer of electrically isolating material has been deposited.
Figure 14:
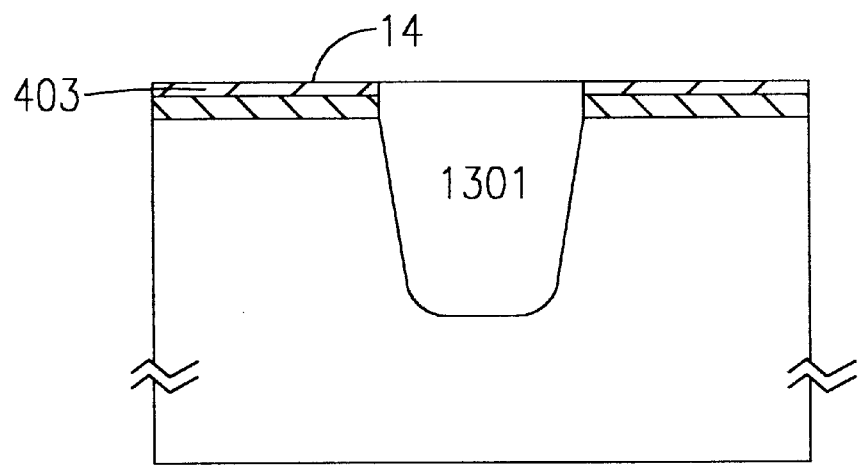
FIG. 14 shows the surface of FIG. 13 after CMP has planarized the surface into the nitride layer creating finished isolation trenches.

This trench can now be effectively doped and filled with electrically isolating materials creating an isolation trench (as shown in FIGS. 12, 13 and 14). The trenches need not be doped and may simply be filled with electrically isolating material creating isolation trenches.

Figure 9:
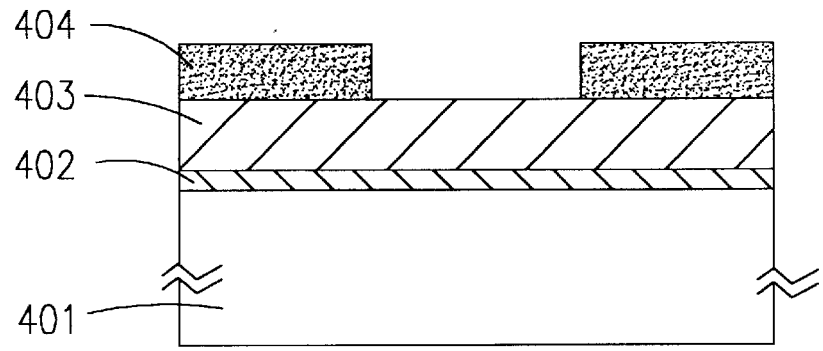
FIG. 9 shows a surface which has already been etched once to remove the shield layer after etching removes the barrier oxide, the photoresist is still in place.

An alternative embodiment is described below. FIG. 9 shows a substrate fabricated in accordance with the present invention. It is the same structure as described in FIGS. 4 and 5. The semiconductor substrate (401) has a barrier oxide layer (402). The shield layer (403) and the oxide layer (402) have already been etched through openings in the photoresist mask (404) as in FIG. 5. However, the photoresist remains. The post etch profile is depicted in FIG. 9.

Figure 10:
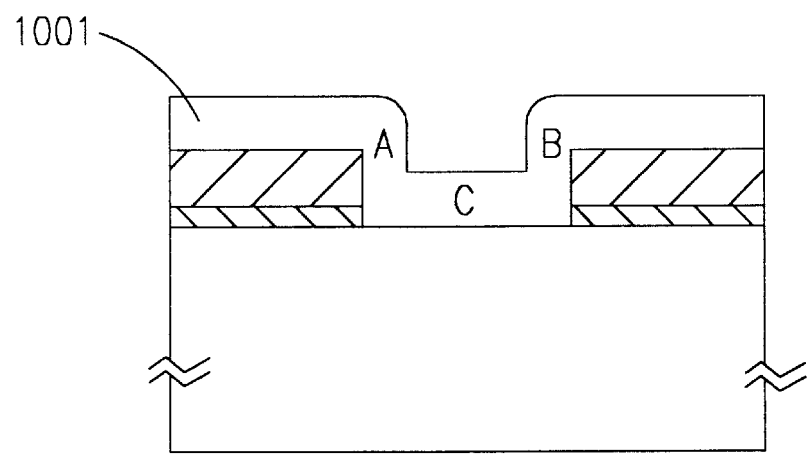
FIG. 10 shows the surface of FIG. 9 after removal of the photoresist and fabrication of a polysilicon layer.

FIG. 10 depicts the deposition of a polysilicon layer (1001) over the surface of FIG. 9 after the photoresist mask has been removed. The deposition is accomplished by any of the methods known to a person with ordinary skill in the art (LPCVD, APCVD, etc.). Due to the nature of the deposition process, the trench regions nearest the trench walls (A and B) have a thicker vertical coat of polysilicon than the trench region nearest the center of the trench (C).

Figure 11:
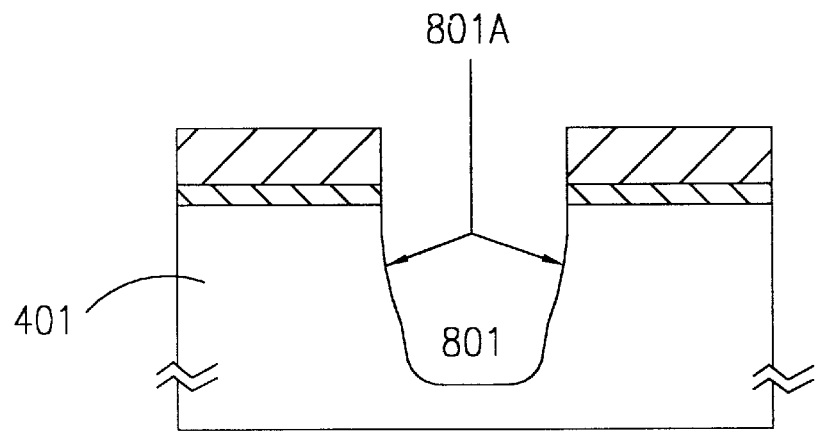
FIG. 11 shows the surface of FIG. 10 after a final etch removes the polysilicon layer and etches away the semiconductor substrate to create a sloped trench profile.

FIG. 11 depicts the effects of a second etch step. The polysilicon layer (1001 of FIG. 10) and the semiconductor substrate in the trench region (801) are etched out in one step, utilizing any of the standard directional etch techniques known by one with ordinary skill in the art (e.g. plasma etching, reactive ion etching, etc.). Due to the directional nature of the third etch and the thicker polysilicon layer regions near the trench edges (A and B of FIG. 10), the trench profile is sloped. FIG. 11 shows the remaining isolation trench (801) in the silicon layer (401) after etching. The walls are sloped in accordance with the invention (801A).

The trenches shown in FIGS. 8 and 11 may be doped by any of the methods known to one with ordinary skill in the art. The preferred method is ion implantation at an angle normal to the substrate surface. Due to the sloped trench wall profile (801A), as shown in FIG. 12, an ion implantation beam (I) normal or near normal to the substrate surface can achieve a nearly uniform doping profile (1201). Furthermore, the sloped profile (801A) increases the edge angle (φ) of FIG. 1 beyond 90° thereby reducing the edge effect, which leads to higher circuit reliability.

Figure 12A:
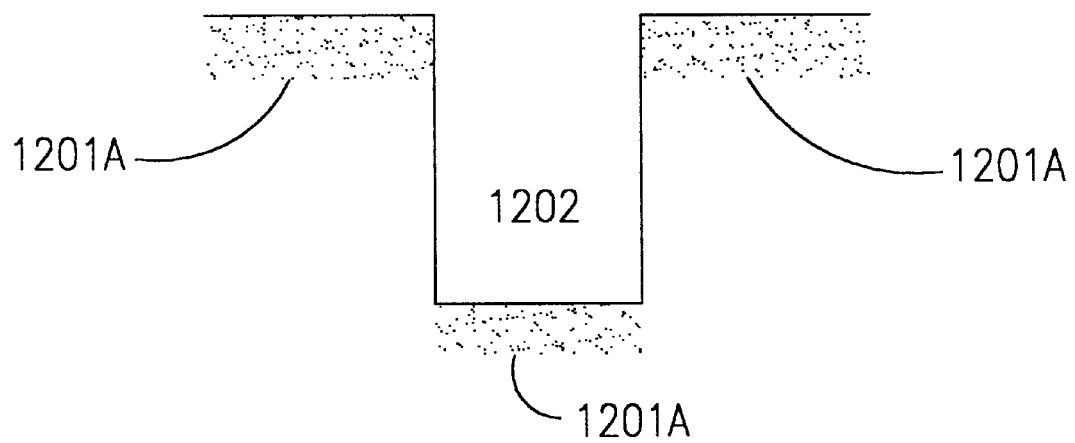
FIG. 12A shows the dopant profile on a vertical walled trench.

This stands in marked contrast with the uneven doping profile of FIG. 12A. The doped regions (1201A) are highly nonuniform when vertical walled trenches (1202) are used. The method of the present invention makes processing simpler and faster with higher circuit reliability. FIG. 13 shows the isolation process. A surface of either FIG. 8 or 11 is covered with an electrically isolating material (1305), preferably silicon dioxide, which will serve as the isolation insulator. The nitride layer (403) is covered, as is the trench region (801).

FIG. 14 depicts the same isolation site (as shown in FIG. 13) after it has been ground down by chemical mechanical processes ("CMP") which are known in the art. The CMP grinds the surface into the nitride layer 403, leaving an oxide-filled isolation trench (1301) on a planarized surface (14).

Such isolation trenches are used to isolate specific circuit elements used in the fabrication of microelectronic circuitry.

Figure 15:
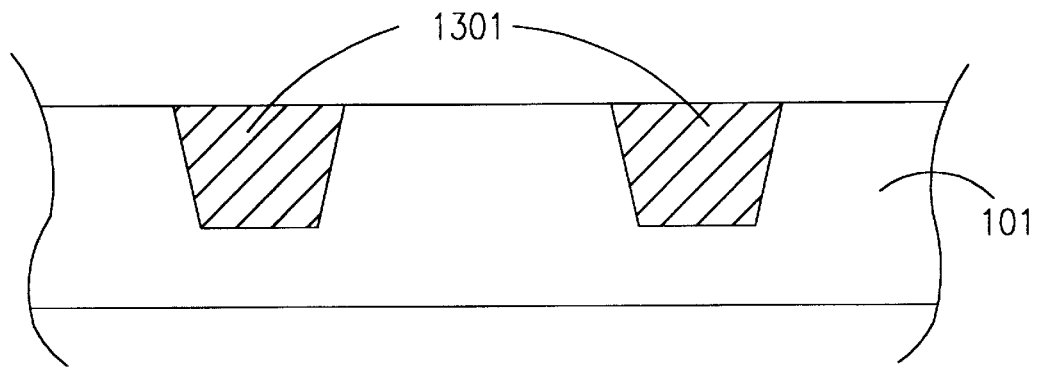
FIG. 15 shows a surface with isolation regions.
Figure 16:
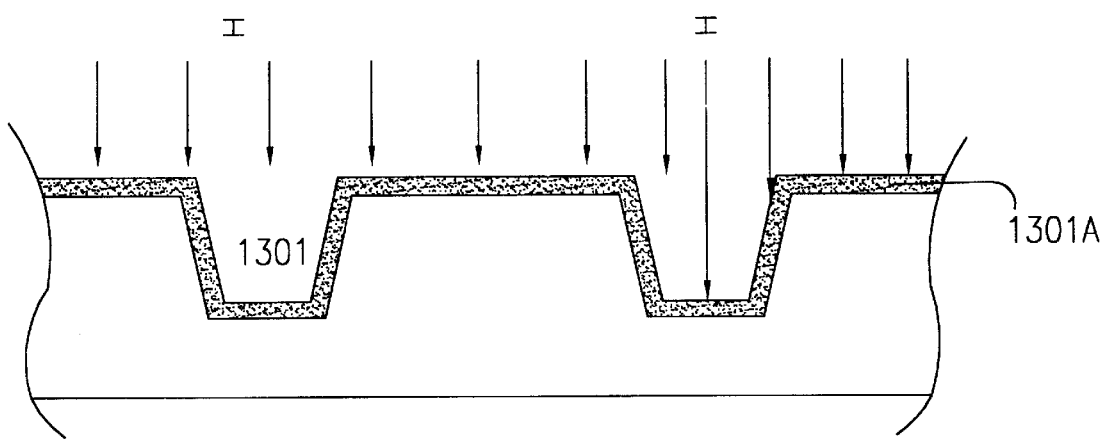
FIG. 16 shows implantation to create current conducting paths.

Yet another application of the invention is to create conducting paths to connect circuit elements. For example, a semiconductor substrate (101) has been processed creating isolation regions (1301) as in FIG. 15. This surface is subject to further processing creating various circuit elements. These elements may need to be electrically connected (for example, connecting a series of transistor sources). One such means of doing so is by using the present invention. This is illustrated by FIG. 16. The isolation regions (1301) are etched away (either partially or completely) by any of the inventions disclosed above.

The present invention has been particularly shown and described with respect to a certain preferred embodiments and the features thereof. However, it should be readily apparent to those of ordinary skill in the art that various changes and modifications in form, semiconductor material, material conductivity type (i.e. N-type or P-type), and detail may be made without departing from the spirit and scope of the invention set forth in the appended claims. This method for fabricating shallow isolation trenches with sloped wall profiles is widely applicable to numerous semiconductor structures. The inventions illustratively disclosed herein may be practiced without any element which is not specifically disclosed herein.

FIG. 16 shows the dopant profile (1301A). Typically doping is performed using an ion implantation beam (I) to implant positively or negatively charged ions into the doped region (1301A). This is easily accomplished due to the sloped trench profile. This dopant layer (1301A) is used to electrically connect a variety of microelectronic circuit elements.

What is claimed is:

1. A method for fabricating shallow isolation trenches with sloped walls in semiconductor substrates, comprising the following steps:

a) providing a semiconductor substrate with a conformal barrier layer and a conformal shield layer;

b) forming a photoresist pattern mask over said conformal shield layer;

c) etching away portions of said shield layer in a first etching step exposing portions of said barrier layer, defining a trench region;

d) removing said photoresist pattern mask;

e) depositing a conformal layer of polysilicon on shield layer and said exposed portions of said barrier layer;

f) etching away portions of said polysilicon layer in a second etching step leaving polysilicon spacers over portions of said barrier layer defining a trench wall region; and g) etching away said spacers, portions of said barrier layer, and a portion of said semiconductor substrate in said trench region in a third etch step, leaving an isolation trench with a sloped trench profile.

2. A method as in claim 1 wherein said conformal barrier layer comprises an oxide.

3. A method as in claim 1 wherein said conformal barrier layer is comprised of silicon dioxide.

4. A method as in claim 2 wherein said conformal shield layer is selected from the group consisting of silicon nitride and silicon oxynitride.

5. A method as in claim 1 wherein said conformal layer of polysilicon is N- or P-doped.

6. A method as in claim 1 wherein said conformal layer of polysilicon is undoped.

7. A method for fabricating shallow isolation trenches with sloped walls in semiconductor substrates, comprising the following steps:

a) providing a semiconductor substrate with a conformal barrier layer and a conformal shield layer;

b) forming a photoresist pattern mask over said conformal shield layer;

c) etching away portions of said conformal shield layer and said barrier layer, exposing said semiconductor substrate, defining a trench region;

d) removing said photoresist pattern mask;

e) depositing a conformal layer of polysilicon on said shield layer and on said exposed portions of semiconductor substrate; and f) etching away said layer of polysilicon and said semiconductor substrate in a second etch step, leaving a trench with sloped walls.

8. A method as in claim 7 wherein said conformal barrier layer comprises an oxide.

9. A method as in claim 7 wherein said conformal barrier layer is comprised of silicon dioxide.

10. A method as in claim 7 wherein said conformal shield layer is selected from the group consisting of silicon nitride and silicon oxynitride.

11. A method as in claim 7 wherein said conformal layer of polysilicon is either N- or P-doped.

12. A method as in claim 7 wherein said conformal layer of polysilicon is undoped.

\* \* \* \* \*